United States Patent
Biswas et al.

(10) Patent No.: US 12,414,467 B2
(45) Date of Patent: Sep. 9, 2025

(54) P-TYPE MATERIAL, AND IMPLEMENTATIONS THEREOF

(71) Applicant: Jawaharlal Nehru Centre for Advanced Scientific Research, Karnataka Bangalore (IN)

(72) Inventors: Kanishka Biswas, Karnataka Bangalore (IN); Subhajit Roychowdhury, Karnataka Bangalore (IN); Tanmoy Ghosh, Karnataka Bangalore (IN)

(73) Assignee: JAWAHARLAL NEHRU CENTRE FOR ADVANCED SCIENTIFIC RESEARCH, Karnataka Bangalore (IN)

( * ) Notice: Subject to any disclaimer, the term of this patent is extended or adjusted under 35 U.S.C. 154(b) by 907 days.

(21) Appl. No.: 17/626,953

(22) PCT Filed: Jul. 8, 2020

(86) PCT No.: PCT/IN2020/050595
§ 371 (c)(1),
(2) Date: Jan. 13, 2022

(87) PCT Pub. No.: WO2021/009771
PCT Pub. Date: Jan. 21, 2021

(65) Prior Publication Data
US 2022/0263004 A1   Aug. 18, 2022

(30) Foreign Application Priority Data
Jul. 15, 2019   (IN) .............................. 201941028467

(51) Int. Cl.
*C01B 19/00*   (2006.01)
*H10N 10/01*   (2023.01)
*H10N 10/852*   (2023.01)

(52) U.S. Cl.
CPC ......... *H10N 10/852* (2023.02); *C01B 19/002* (2013.01); *H10N 10/01* (2023.02)

(58) Field of Classification Search
CPC ...... H10N 10/852; H10N 10/01; H10N 10/17; C01B 19/002; C22C 5/06; C22C 28/00
See application file for complete search history.

(56) References Cited

U.S. PATENT DOCUMENTS

2005/0076944 A1*   4/2005   Kanatzidis ........... H10N 10/852
136/239

OTHER PUBLICATIONS

Biswas et al, "High-performance bulk thermoelectrics with all-scale hierarchical architectures," Nature, vol. 489, pp. 414-418 (2012).
Guin et al, "Enhanced thermoelectric performance in p-type AgSbSe2 by Cd-doping" RSC Advances, vol. 4, pp. 11811-11815 (2014).
Sootsman et al, "New and Old Concepts in Thermoelectric Materials," Angewandte Chemie International Edition, vol. 48, pp. 8616-8639 (2009).
Zhao et al, "The panoscopic approach to high performance thermoelectrics," Energy & Environmental Science, vol. 7, pp. 251-268 (2014).
Zhao et al., "Ultralow thermal conductivity and high thermoelectric figure of merit in SnSe crystals," Nature, vol. 508, pp. 373-390 (2014).
Int'l Search Report and Written Opinion issued Oct. 8, 2020 in Int'l Application No. PCT/IN2020/050595.
Examination Report issued on Jun. 1, 2022 in IN Application No. 201941028467.
Roychowdhury et al., "Ultrahigh Thermoelectric Figure of Merit and Enhanced Mechanical Stability of p-type AgSb1-xZnxTe2," ACS Energy Letters, vol. 2, pp. 349-356 (2017).

* cited by examiner

*Primary Examiner* — Jessee R Roe
(74) *Attorney, Agent, or Firm* — Panitch Schwarze Belisario & Nadel LLP

(57) ABSTRACT

The present disclosure discloses a p-type material of Formula I: $AgSb_{1-x}Cd_xTe_2$, wherein x is in a range of 0.01-0.07. It further discloses a process of preparation of the p-type material, and the use of the p-type material as a thermoelectric material.

13 Claims, 6 Drawing Sheets

P-TYPE MATERIAL, AND IMPLEMENTATIONS THEREOF

CROSS-REFERENCE TO RELATED APPLICATIONS

This application is a Section 371 of International Application No. PCT/IN2020/050595, filed Jul. 8, 2020, which was published in the English language on Jan. 21, 2021, under International Publication No. WO 2021/009771 A1, which claims priority under 35 U.S.C. § 119 to Indian Application No. 201941028467, filed Jul. 15, 2019, the disclosure of each of which is incorporated herein by reference in its entirety.

TECHNICAL FIELD

The subject matter described herein in general relates to thermoelectric materials. In particular, it relates to the field of p-type lead free materials.

BACKGROUND OF INVENTION

Energy and the environment have become critical issues in the 21st century. About 65% of utilized energy gets lost as waste heat which is alarming, particularly in anticipation of future global energy crisis. The urgent need for sources of energy other than fossil fuels, as well as the most efficient use of existing fossil-fuel supply, has prompted research into alternative energy sources and various types of energy conversion technologies.

In the modern electronic age, the technological demands mean sleeker and smaller electronic appliances. These sleeker and smaller electronic appliances have become the norm. Such advancements have been possible owing to the strides made by the micro-electronics sector. At the forefront, this has improved due to the understanding of electronic structures of bulk material, thereby allowing scientists to tune band gaps as per requirement.

One type of energy conversion technology that has gained renewed attention is thermoelectric (TE) energy conversion, wherein heat is converted directly into electricity using a class of materials known as thermoelectric materials.

Thermoelectric materials, with their ability to convert waste heat into electricity, offer a promising solution to the increasing global energy demand. Practical applications of thermoelectric materials require the innovation of cost-effective, environment-friendly and scalable materials with easy synthesis process and high thermoelectric figure of merit, zT over a wide temperature range. Over the years, many materials, such as PbTe with high zT have been discovered. (J. Sootsman et al., Angew. Chem. Int. Ed. 2009, 48, 8616; K. Biswas et al., Nature 2012, 489, 414; L. D. Zhao et al., Energy Environ. Sci. 2014, 7, 251).

Lead chalcogenides (PbTe/PbSe/PbS) and their alloys have been widely considered as the best performing materials for thermoelectric power generation at mid-/high-temperatures (600-900 K), however, said materials are based on toxic elements, i.e., lead. Therefore, the utmost challenge in the thermoelectric (TE) research is to develop environment-friendly high performance thermoelectric materials, particularly for applications in the low- to mid-temperature regime (300-600 K).

Recently, a record high zT~2.6 at 923 K has been realized in single crystal SnSe along b-axis (L.-D. Zhao et al., Nature 2014, 508, 373). However, the difficulty to prepare materials in a large scale in their single crystalline form often limits the practical applicability. High performance polycrystalline thermoelectric materials, on the other hand, with their relatively easy and quick synthesis process, scalability, are more promising for practical applications.

SUMMARY OF THE INVENTION

In an aspect of the present disclosure, there is provided a p-type material of Formula I:

$$AgSb_{1-x}Cd_xTe_2 \quad \text{Formula I,}$$

wherein x is in a range of 0.01-0.07.

In an aspect of the present disclosure, there is provided a process for preparing the p-type material of Formula I, wherein x is in a range of 0.01-0.07, the process comprising: (a) contacting a combination of precursors selected from silver, antimony, cadmium and tellurium to obtain a first mixture; (b) heating the first mixture at a first temperature followed by heating at a second temperature to obtain a melt; (c) processing the melt to obtain a second mixture; and (d) cooling the second mixture to obtain the p-type material.

In another aspect of the present disclosure, there is provided a use of p-type material of the present disclosure, as a thermoelectric material.

These and other features, aspects, and advantages of the present subject matter will be better understood with reference to the following description and appended claims. This summary is provided to introduce a selection of concepts in a simplified form. This summary is not intended to identify key features or essential features of the claimed subject matter, nor is it intended to be used to limit the scope of the claimed subject matter.

BRIEF DESCRIPTION OF THE DRAWINGS

The detailed description is described with reference to the accompanying figures. The same numbers are used throughout the drawings to reference like features and components.

image of AgSbTe$_2$ (comparative material), in accordance with an implementation of the present subject matter.

Figure 7:
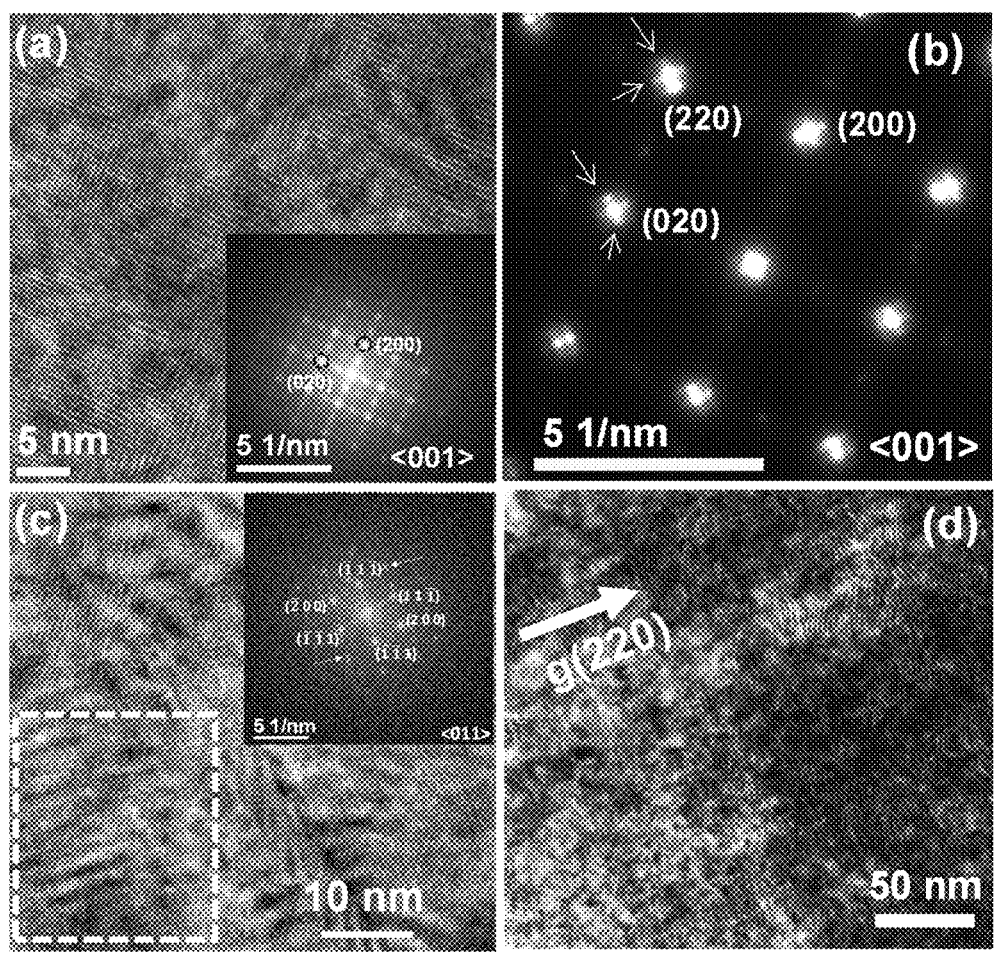

FIG. 7 illustrates a high-resolution TEM (HRTEM) image of the p-type materials of Formula I, in accordance with an implementation of the present subject matter.

DETAILED DESCRIPTION OF THE INVENTION

Those skilled in the art will be aware that the present disclosure is subject to variations and modifications other than those specifically described. It is to be understood that the present disclosure includes all such variations and modifications. The disclosure also includes all such steps, features, compositions, and compounds referred to or indicated in this specification, individually or collectively, and any and all combinations of any or more of such steps or features.

Definitions

For convenience, before further description of the present disclosure, certain terms employed in the specification, and examples are delineated here. These definitions should be read in the light of the remainder of the disclosure and understood as by a person of skill in the art. The terms used herein have the meanings recognized and known to those of skill in the art, however, for convenience and completeness, particular terms and their meanings are set forth below.

The articles "a", "an" and "the" are used to refer to one or to more than one (i.e., to at least one) of the grammatical object of the article.

The terms "comprise" and "comprising" are used in the inclusive, open sense, meaning that additional elements may be included. It is not intended to be construed as "consists of only".

Throughout this specification, unless the context requires otherwise the word "comprise", and variations, such as "comprises" and "comprising", will be understood to imply the inclusion of a stated element or step or group of element or steps but not the exclusion of any other element or step or group of element or steps.

The term "including" is used to mean "including but not limited to". "Including" and "including but not limited to" are used interchangeably.

Ratios, concentrations, amounts, and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a temperature range of about 1100-1300 K should be interpreted to include not only the explicitly recited limits of about 1100 K to about 1300 K, but also to include sub-ranges, such as 1100-1250K, 1150-1300K, and so forth, as well as individual amounts, including fractional amounts, within the specified ranges, such as 1100.2 K, and 1259.5 K, for example.

The term "at least one" is used to mean one or more and thus includes individual components as well as mixtures/combinations.

The term "p-type material" is used to refer to semiconductor material that has an excess of holes in its valence band.

The phrase "room to mid temperature" refers to the temperature between 300 K to 600 K.

Unless defined otherwise, all technical and scientific terms used herein have the same meaning as commonly understood by one of ordinary skill in the art to which this disclosure belongs. Although any methods and materials similar or equivalent to those described herein can be used in the practice or testing of the disclosure, the preferred methods, and materials are now described. All publications mentioned herein are incorporated herein by reference.

The present disclosure is not to be limited in scope by the specific embodiments described herein, which are intended for the purposes of exemplification only. Functionally-equivalent products, compositions, and methods are clearly within the scope of the disclosure, as described herein.

As mentioned previously, there is a need for high performance polycrystalline thermoelectric materials which are relatively easy and quick to synthesize, scalable and devoid of toxicity. The efficiency of a thermoelectric material depends on the three interdependent parameters—electrical conductivity ($\sigma$), Seebeck coefficient (S), and total thermal conductivity ($\kappa$) via the following expression $$zT = \sigma S^2 T/\kappa$$

Unfortunately, the strong interdependence among $\sigma$, S, and $\kappa_{el}$ ($\kappa_{el}$ electronic thermal conductivity) makes it challenging to realize high zT over a broad temperature range. High thermoelectric figure of merit (zT) over a broad temperature range ($ZT_{dev}$) is the critical factor rather than $zT_{max}$, as the heat to electrical energy conversion efficiency ($\eta_{TE}$) directly depends on $ZT_{dev}$.

The present disclosure identifies a thermoelectric material to overcome the problems discussed above. Said material being a p-type material of Formula I:

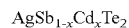

Formula I, wherein x is in a range of 0.01-0.07. The p-type material of Formula I of the present disclosure demonstrates that Cd doping in polycrystalline AgSbTe$_2$ gradually dissolves the n-type Ag$_2$Te impurity phases with increasing Cd concentration and consequently, the hole concentration and electrical conductivity of the system increases. More importantly, it was observed that increased Cd doping in the system facilitated the cationic ordering and results in the formation of nanoscale superstructures. The spontaneous formation of these nanoscale superstructures increased phonon scattering and further suppressed the thermal conductivity. The room temperature lattice thermal conductivity decreased from 0.48 W/mK in pristine AgSbTe$_2$ to 0.16 W/mK in AgSb$_{0.94}$Cd$_{0.06}$Te$_2$. Consequently, room temperature zT ~0.6 of AgSbTe$_2$ increased to 1.5 in AgSb$_{0.94}$Cd$_{0.06}$Te$_2$. The highest obtained zT ($zT_{max}$) in AgSb$_{0.94}$Cd$_{0.06}$Te$_2$ is 2.6 at 573 K which outperformed state-of-the-art p-type polycrystalline material in the 300-600 K temperature range. Moreover, this new class of compounds with the general formula AgSb$_{1-x}$Cd$_x$Te$_2$ was found to reveal enhanced thermoelectric properties.

In an embodiment of the present disclosure, there is provided a p-type material of Formula I:

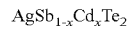

Formula I, wherein x is in a range of 0.01-0.07.

In an embodiment of the present disclosure, there is provided a p-type material of Formula I, wherein x is in a range 0.02-0.06.

In an embodiment of the present disclosure, there is provided a p-type material of Formula I, wherein x is 0.06.

In an embodiment of the present disclosure, there is provided a p-type material of Formula I as described herein, wherein the material has a lattice thermal conductivity ($\kappa_{lat}$) at 300 K in a range of 0.34-0.16 W/mK.

In an embodiment of the present disclosure, there is provided a p-type material of Formula I as described herein, wherein the material has electrical conductivity ($\sigma$) at 300 K in a range of 156-222 S/cm.

In an embodiment of the present disclosure, there is provided a p-type material of Formula I as described herein, wherein the material has a thermoelectric figure of merit (zT) at 300 K in a range of 0.8-1.5.

In an embodiment of the present disclosure, there is provided a p-type material of Formula I as described herein, wherein the material has a thermoelectric figure of merit (zT) at 573 K in a range of 1.8-2.6.

In an embodiment of the present disclosure, there is provided a process for preparing the p-type material of Formula I $AgSb_{1-x}Cd_xTe_2$, wherein x is in a range of 0.01-0.07, the process comprising: (a) contacting a combination of precursors selected from silver, antimony, cadmium and tellurium to obtain a first mixture; (b) heating the first mixture at a first temperature followed by heating at a second temperature to obtain a melt; (c) processing the melt to obtain a second mixture; and (d) cooling the second mixture to obtain the p-type material.

In an embodiment of the present disclosure, there is provided a process for preparing the p-type material of Formula I as described herein, the process comprising: (a) contacting a combination of precursors selected from silver, antimony, cadmium and tellurium to obtain a first mixture; (b) heating the first mixture at a first temperature followed by heating at a second temperature to obtain a melt; (c) processing the melt to obtain a second mixture; and (d) cooling the second mixture to obtain the p-type material, wherein heating the first mixture at a first temperature is carried out at a temperature of 650-750 K for a period in the range of 10-14 hours under a pressure in the range of $10^{-4}$-$10^{-6}$ torr.

In an embodiment of the present disclosure, there is provided a process for preparing the p-type material of Formula I $AgSb_{1-x}Cd_xTe_2$, wherein x is in a range of 0.01-0.07, the process comprising: (a) contacting a combination of precursors selected from silver, antimony, cadmium and tellurium to obtain a first mixture; (b) heating the first mixture at a first temperature followed by heating at a second temperature to obtain a melt; (c) processing the melt to obtain a second mixture; and (d) cooling the second mixture to obtain the p-type material, wherein heating at a second temperature is carried out at a temperature in the range of 1100 to 1200 K for a period in the range of 2-5 hours under a pressure in the range of $10^{-4}$-$10^{-6}$ torr.

In an embodiment of the present disclosure, there is provided a process for preparing the p-type material of Formula I $AgSb_{1-x}Cd_xTe_2$, wherein x is in a range of 0.01-0.07, the process comprising: (a) contacting a combination of precursors selected from silver, antimony, cadmium and tellurium to obtain a first mixture; (b) heating the first mixture at a first temperature followed by heating at a second temperature to obtain a melt; (c) processing the melt to obtain a second mixture; and (d) cooling the second mixture to obtain the p-type material, wherein processing the melt to obtain a second mixture is carried out by soaking the melt for a period in the range of 5-10 hours for temperature in the range of 1100-1200 K under a pressure in the range of $10^{-4}$-$10^{-6}$ torr.

In an embodiment of the present disclosure, there is provided a process for preparing the p-type material of Formula I $AgSb_{1-x}Cd_xTe_2$, wherein x is in a range of 0.01-0.07, the process comprising: (a) contacting a combination of precursors selected from silver, antimony, cadmium and tellurium to obtain a first mixture; (b) heating the first mixture at a first temperature followed by heating at a second temperature to obtain a melt; (c) processing the melt to obtain a second mixture; and (d) cooling the second mixture to obtain the p-type material, wherein cooling the second mixture is carried out at a cooling rate in the range of 0.65-0.75 K/min to achieve a temperature of in the range of 290-320 K.

In an embodiment of the present disclosure, a p-type material is $AgSb_{0.94}Cd_{0.06}Te_2$.

In an embodiment of the present disclosure, a p-type material is $AgSb_{0.98}Cd_{0.02}Te_2$.

In an embodiment of the present disclosure, a p-type material is $AgSb_{0.96}Cd_{0.04}Te_2$.

In an embodiment of the present disclosure, there is provided a use of p-type material as described herein, as a thermoelectric material.

In an embodiment of the present disclosure, there is provided a p-type material as described herein, for use as a thermoelectric material.

In an embodiment of the present disclosure, there is provided a p-type material as described herein, wherein the material is a lead-free material.

EXAMPLES

The disclosure will now be illustrated with working examples, which is intended to illustrate the working of disclosure and not intended to take restrictively to imply any limitations on the scope of the present disclosure. Unless defined otherwise, all technical and scientific terms used herein have the same meaning as commonly understood to one of ordinary skill in the art to which this disclosure belongs. Although methods and materials similar or equivalent to those described herein can be used in the practice of the disclosed methods and compositions, the exemplary methods, devices and materials are described herein. It is to be understood that this disclosure is not limited to particular methods, and experimental conditions described, as such methods and conditions may apply.

The present disclosure provides a p-type material of Formula I:

$$AgSb_{1-x}Cd_xTe_2 \qquad \text{Formula I,}$$

wherein x is in a range of 0.01-0.07. The p-type material of the present disclosure provides excellent thermoelectric performance over a wide temperature range (300-600 K). A significant enhancement in the room temperature thermoelectric figure of merit (zT) was observed, i.e., polycrystalline $AgSbTe_2$ upon Cd doping resulted in enhancement from 0.6 to 1.5 at 300 K. Further, the maximum zT ($zT_{max}$) of 2.6 at 573 K in polycrystalline $AgSb_{0.94}Cd_{0.06}Te_2$ was observed. Moreover, the highest device figure of merit ($ZT_{dev}$) of ~1.9 in polycrystalline $AgSb_{0.94}Cd_{0.06}Te_2$ was obtained which outperforms all other state-of-the-art p-type thermoelectric materials in the 300-600 K temperature range.

Furthermore, the polycrystalline $AgSb_{0.94}Cd_{0.06}Te_2$ showed high zT over a wide temperature range (300-600 K). As a result, $AgSb_{0.94}Cd_{0.06}Te_2$ exhibited a calculated efficiency of ~15% by considering cold and hot temperature of 300 K and 600 K, respectively. The high zT of polycrystalline $AgSb_{0.94}Cd_{0.06}Te_2$ over a wide temperature range (300-600 K) also eliminates the necessity of different materials for different regime, such as $Bi_2Te_3$ for room temperature applications and Ge and Pb chalcogenide for mid-temperature applications.

Materials and Methods

Reagents-Silver (Ag, Aldrich 99.999%), antimony (Sb, Alfa Aesar 99.9999%), cadmium (Cd, Aldrich 99.5%) and tellurium (Te, Alfa Aesar 99.999+%) were used for synthesis without further purification.

Powder X-ray diffractions for all synthesized samples were recorded using a Cu Kα (λ=1.5406 Å) radiation source on a Bruker D8 powder diffractometer.

Differential scanning calorimetry (DSC) data was measured by TA instrument (DSC Q2000) with a heating/cooling rate of 5 K/min between 290 and 660 K in $N_2$ atmosphere.

Electrical conductivity and Seebeck coefficients were measured simultaneously under a helium atmosphere from room temperature to 600 K on a ULVAC-RIKO ZEM-3 instrument system. The typical sample for measurement had a parallelepiped shape with the dimensions of ~2×2×8 $mm^3$. The longer direction coincides with the direction of thermal conductivity measured. Electrical and thermal transport properties are measured in the same directions.

Specific heat capacity at low temperatures (2-35 K) was measured using Physical Property Measurement System (PPMS).

Hall measurement of all the samples was carried out in a setup developed by Excel instrument where a variable magnetic field of 0-0.55 T and dc current of 100 mA were used at room temperature.

TEM imaging was performed using an aberration corrected FEI TITAN cubed 80-300 keV transmission electron microscope, operating at 300 kV.

Thermal diffusivity, D, was directly measured in the range 300-600 K by using the laser flash diffusivity method in a Netzsch LFA-457 under nitrogen atmosphere. Coins with ~8 mm diameter and ~2 mm thickness were used in all of the measurements. Temperature dependent (300-600) heat capacity, $C_p$, of p-type materials of formula I was derived using the standard sample (pyroceram) in LFA-457, which is in good agreement with Dulong-Petit $C_p$ value. The total thermal conductivity, κ, was estimated using the formula $κ=DC_pρ$, where D is thermal diffusivity of the sample, and ρ is the density (~97% theoretical density; refer Table 1). Electronic thermal conductivity ($κ_{el}$) of p-type materials of formula I was estimated from the Wiedemann-Franz law, $κ_{el}=L·σ·T$, where L is the Lorenz number, and σ is the electrical conductivity at temperature T. Temperature dependent L was calculated based on the fitting of temperature dependent Seebeck coefficient assuming a single parabolic band model. Lattice thermal conductivities ($κ_{lat}$) of all samples are obtained by subtracting the $κ_{el}$ from κ.

TABLE 1

Density of $AgSb_{1-x}Cd_xTe_2$ (x = 0.0, 0.02, 0.04 and 0.06,) samples.

| Composition | Experimental density (gm/cm$^3$) |
|---|---|
| $AgSbTe_2$ | 6.9 |
| $AgSb_{0.98}Cd_{0.02}Te_2$ | 6.91 |
| $AgSb_{0.96}Cd_{0.04}Te_2$ | 6.94 |
| $AgSb_{0.94}Cd_{0.06}Te_2$ | 6.95 |

Example 1: Synthesis of p-Type Material of Formula I

First, ingots (~9 g) of $AgSb_{1-x}Cd_xTe_2$ (x=0, 0.02, 0.04 and 0.06) were synthesized by mixing stoichiometric amounts of high purity starting materials of Ag, Sb, Cd and Te in quartz ampules (first mixture). The tubes were sealed under vacuum ($10^{-5}$ Torr) and were slowly heated to 673 K (first temperature) and then to 1123 K (second temperature) over a time period of 12 and 4 hours, respectively to obtain a melt, the melt was then soaked for 10 hours at a temperature of 1123K under a pressure of $10^{-5}$ torr to obtain a second mixture (processing), and then the second mixture was slowly cooled to room temperature over a period of 20 hours at a cooling rate in the range of 0.65-0.75 K/min to achieve a temperature of in the range of 290-320 K to obtain the p-type material.

Example 2: Characterization and Testing of p-Type Materials of Formula I

Figure 1:
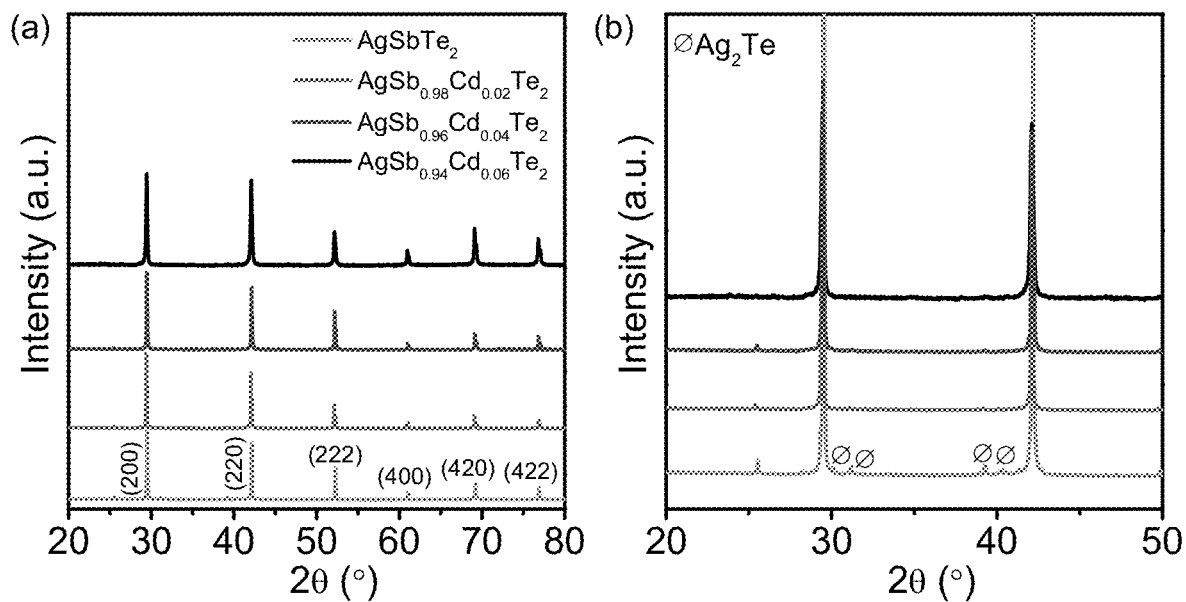
FIG. 1(a-b) illustrates the powder x-ray diffraction (XRD) spectrum of the p-type materials of Formula I, in accordance with an implementation of the present subject matter.

The p-type material of Formula I obtained by the process of Example 1 were characterized by powder X-ray diffraction (PXRD) spectrometry (FIG. 1). It is worthy to note that PXRD patterns (FIG. 1a) of the as-synthesized polycrystalline $AgSb_{1-x}Cd_xTe_2$ (x=0, 0.02, 0.04 and 0.06) samples could be indexed with cubic rocksalt type structure space group, Fm-3m.

Figure 2:
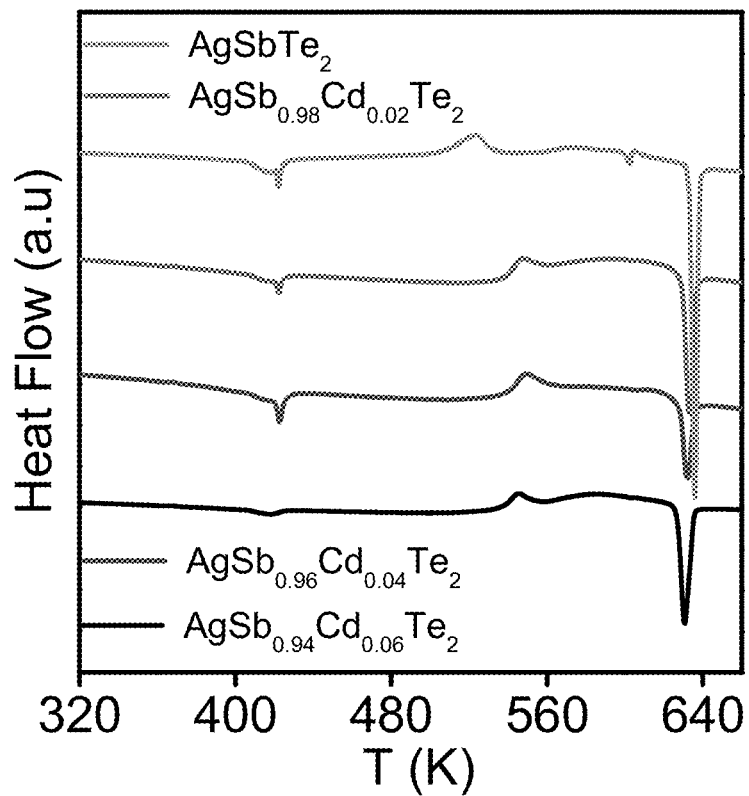
FIG. 2 illustrates the differential scanning calorimetry (DSC) curves for the p-type materials of Formula I, in accordance with an implementation of the present subject matter.

Even though, the intrinsically glass-like ultralow thermal conductivity (0.6-0.7 W/mK) of $AgSbTe_2$ makes it a promising candidate for thermoelectric applications, its poor thermal stability owing to the formation of n-type $Ag_2Te$ leads to a loss in thermoelectric performance (K. Biswas et al., ACS Energy Lett., 2017, 2, 349). It was observed that with increasing Cd concentration in $AgSbTe_2$, the presence of diffraction peaks corresponding to the $Ag_2Te$ impurity phase in the pristine $AgSbTe_2$, gradually disappeared, confirming the positive role of Cd doping in blocking the $Ag_2Te$ phase formation (FIG. 1b: zoomed version (2θ=20-50°) of PXRD pattern of $AgSb_{1-x}Cd_xTe_2$ (x=0.0, 0.02 0.04 and 0.06 samples). The suppression of the formation of $Ag_2Te$ impurity phase is further confirmed by DSC analysis (FIG. 2: DSC curves for $AgSb_{1-x}Cd_xTe_2$ (x=0.0, 0.02, 0.04, and 0.06 samples). The endothermic peak at 425 K corresponding to the structural transition of α-$Ag_2Te$ to β-$Ag_2Te$ disappeared nearly for x>0.04 in $AgSb_{1-x}Cd_xTe_2$.

Figure 3:
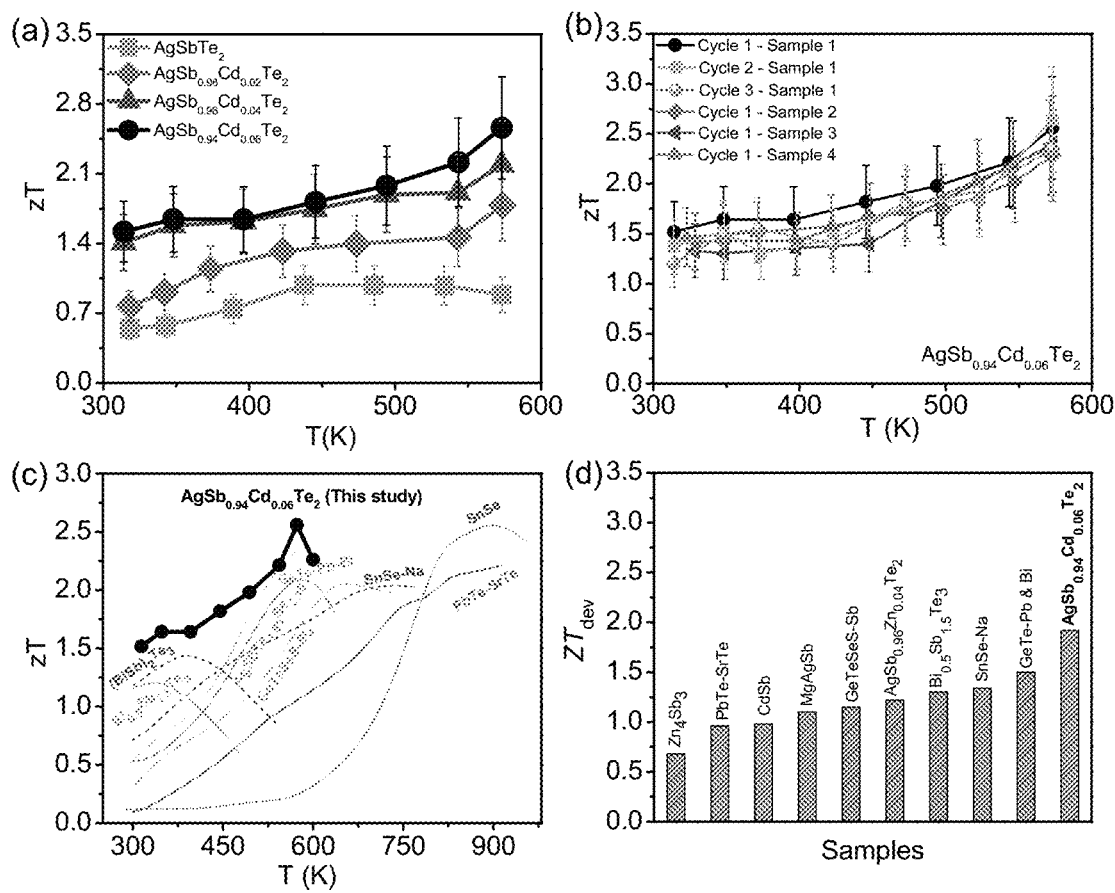
FIG. 3(a-d) illustrates the (a) temperature dependent thermoelectric figure of merit of the p-type materials of Formula I; (b) reproducibility and stability of thermoelectric figure of merit of the p-type material of Formula I; (c) comparative thermoelectric figure of merit of the p-type material of Formula I with the state of art thermoelectric materials as a function of temperature; and (d) device zT ($ZT_{dev}$) for state of art thermoelectric materials in comparison to the p-type material of Formula I, in accordance with an implementation of the present subject matter.

Cd substitution in $AgSbTe_2$ significantly enhanced the thermoelectric figure of merit (zT), throughout the measured temperature range (300-600 K). With the best working example being, $AgSb_{0.94}Cd_{0.06}Te_2$. At 300 K, zT increased from 0.6 for $AgSbTe_2$ to 1.5 for $AgSb_{0.94}Cd_{0.06}Te_2$ and further increased to 2.6 at 573 K (FIG. 3a; Temperature dependent thermoelectric figure of merit (zT) of $AgSb_{1-x}Cd_xTe_2$). The reproducibility and stability of such high thermoelectric performance were confirmed by repeating the entire experiments several times and FIG. 3b presents the measured data taken from different cycles and batches of $AgSb_{0.94}Cd_{0.06}Te_2$ samples. For zT measurement, a 20% error bar was considered, which includes the error in electrical conductivity, Seebeck coefficient and thermal conductivity measurement. Importantly, $AgSb_{0.94}Cd_{0.06}Te_2$ outperformed all other state-of-the-art p-type (both polycrystalline and single crystalline) thermoelectric materials in the temperature range of 300K-600K (FIG. 3c). The high zT throughout the measured temperature range (300-600 K) in $AgSb_{0.94}Cd_{0.06}Te_2$ resulted in a record high $ZT_{dev}$ of ~1.9 (FIG. 3d). As a result, $AgSb_{0.94}Cd_{0.06}Te_2$ exhibited a calculated efficiency of ~15% by considering the cold and hot temperature of 300 K and 600 K, respectively.

Figure 4:
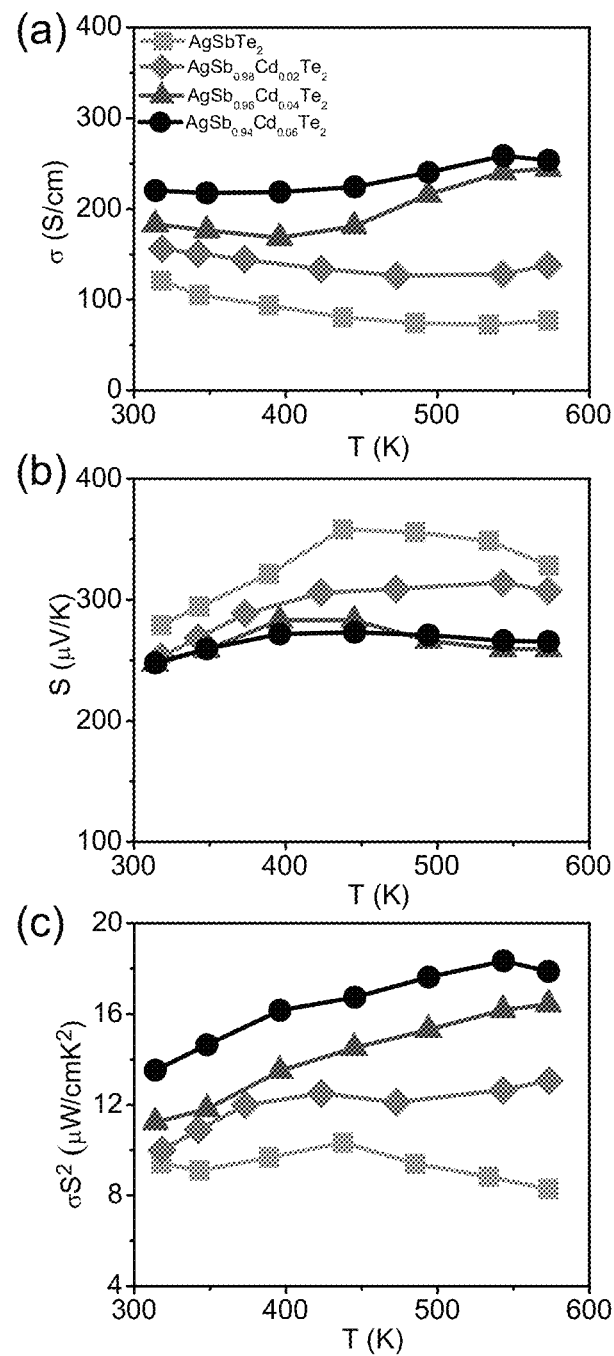
FIG. 4(a-c) illustrate the temperature dependent (a) electrical conductivity, (b) Seebeck coefficient, (c) power factor of the p-type materials of Formula I, in accordance with an implementation of the present subject matter.

Advantageous effect of Cd on both electronic and phonon structure of $AgSbTe_2$ were observed in material $AgSb_{0.94}Cd_{0.06}Te_2$. The temperature variation of electrical conductivity (σ) of polycrystalline $AgSb_{1-x}Cd_xTe_2$ is shown in FIG. 4a. The aliovalent substitution of $Cd^{2+}$ at $Sb^{3+}$ site in $AgSbTe_2$ increased the room temperature hole concentration in the system from $1.1\times10^{19}$ cm$^{-3}$ for pristine $AgSbTe_2$ to $2.5\times10^{20}$ cm$^{-3}$ for $AgSb_{0.94}Cd_{0.06}Te_2$ (refer Table 2).

TABLE 2

Carrier concentration (n) and carrier mobility (μ) of $AgSb_{1-x}Cd_xTe_2$ (x = 0.0, 0.02, 0.04 and 0.06) samples at room temperature:

| Sample | n (cm$^{-3}$) | μ (cm$^2$V$^{-1}$S$^{-1}$) |
|---|---|---|
| $AgSbTe_2$ | $1.1 \times 10^{19}$ | 68.7 |
| $AgSb_{0.98}Cd_{0.02}Te_2$ | $6.7 \times 10^{19}$ | 14.5 |
| $AgSb_{0.96}Cd_{0.04}Te_2$ | $1.2 \times 10^{20}$ | 9.4 |
| $AgSb_{0.94}Cd_{0.06}Te_2$ | $2.5 \times 10^{20}$ | 5.5 |

Furthermore, as mentioned previously, the formation of n-type $Ag_2Te$ impurity phase also decreases with increasing Cd concentration. As a result, the room temperature electrical conductivity σ increases from ~121 S/cm for pristine $AgSbTe_2$ to ~156-222 S/cm for $AgSb_{0.94}Cd_{0.06}Te_2$ confirming that $Cd^{2+}$ acts as an effective acceptor dopant.

The temperature dependence of Seebeck coefficient (S) of $AgSb_{1-x}Cd_xTe_2$ samples is presented in FIG. 4b. Positive Seebeck coefficient value indicated the p-type electronic conduction, which was also consistent with the Hall coefficient data. The Seebeck coefficient of pristine $AgSbTe_2$ was 279 μV/K at room temperature which further increased to 360 μV/K at 436 K. The origin of this large Seebeck coefficient in $AgSbTe_2$ was because of the presence of flat and multi-valley valence band near the Fermi level. The Cd doping gradually increased the hole concentration in the system ($AgSbTe_2$) and as a result, at room temperature, Seebeck coefficient decreased from 279 μV/K for pristine $AgSbTe_2$ to ~248 μV/K for $AgSb_{0.94}Cd_{0.06}Te_2$ at room temperature. Although the hole carrier concentration increased with increasing Cd concentration, $AgSb_{1-x}Cd_xTe_2$ samples exhibited a comparatively large Seebeck coefficient compared to other state of art materials which can be attributed to the high density of state effective mass of the Cd doped samples. The calculated values of m* for $AgSbTe_2$ and $AgSb_{0.94}Cd_{0.06}Te_2$, samples are 1.35 $m_0$, and 8.45 $m_0$, respectively.

Figure 5:
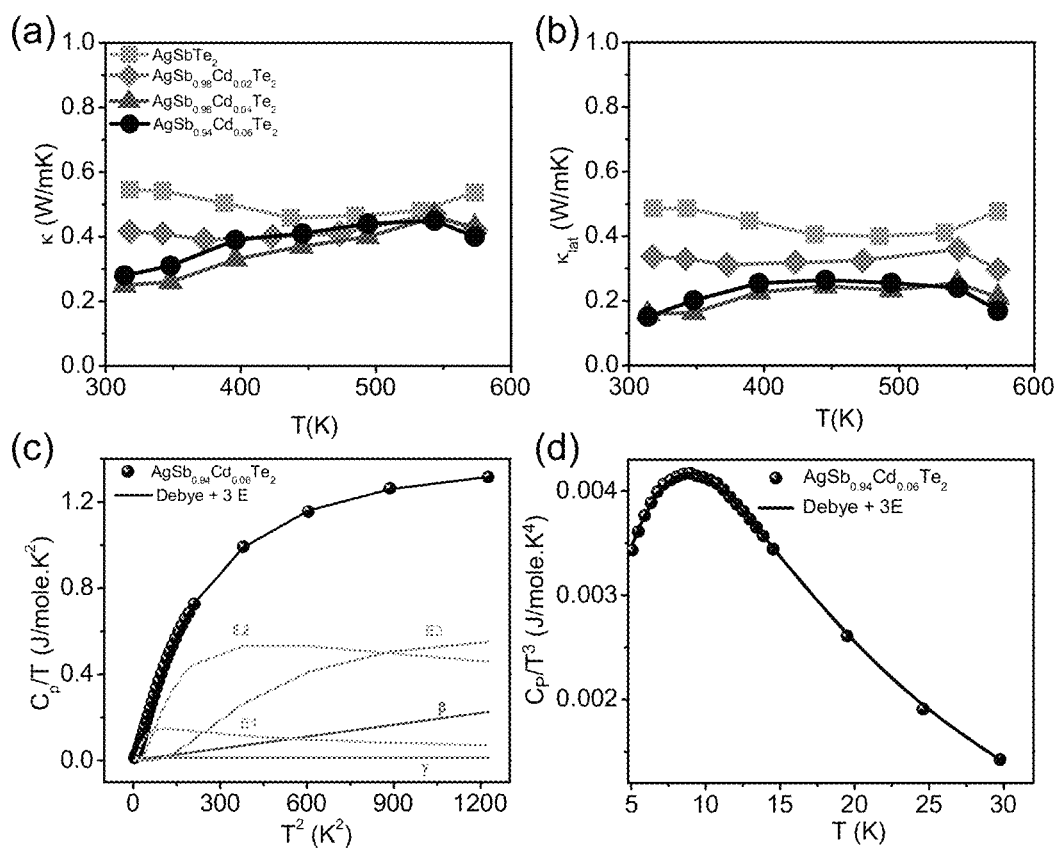
FIG. 5(a-d) illustrates temperature dependent (a) total thermal conductivity ($\kappa$) (b) lattice thermal conductivity ($\kappa_{lat}$) (c) Cp/T versus $T^2$ plot (d) $C_p/T^3$ versus T plot of the p-type materials of Formula I, in accordance with an implementation of the present subject matter.

Typically, $AgSb_{0.94}Cd_{0.06}Te_2$ sample showed Seebeck coefficient of ~248 μV/K at room temperature which increases to 265 μV/K at 573 K. The increase in m* value along with the increase in carrier concentration can be attributed to the increasing accessibility to the multiple flat valence band valleys of $AgSbTe_2$ with increasing Cd concentration. The high electrical conductivity and high Seebeck coefficient resulted in a high power factor in the $AgSb_{1-x}Cd_xTe_2$ samples throughout the measured temperature range (300-573 K) (FIG. 4c). Power factor value of $AgSb_{0.94}Cd_{0.06}Te_2$ sample (13.6 μWcm$^{-1}$K$^{-2}$ at 317 K and 17.87 μWcm$^{-1}$K$^{-2}$ at 573 K) was significantly high compared to that of pristine $AgSbTe_2$ (9.42 μWcm$^{-1}$K$^{-2}$ at 317 K and 8.29 μWcm$^{-1}$K$^{-2}$ at 573 K). The temperature variation of total thermal conductivity (κ) and lattice thermal conductivity ($κ_{lat}$) of $AgSb_{1-x}Cd_xTe_2$ is shown in FIG. 5a and FIG. 5b, respectively. The room temperature κ of pristine $AgSbTe_2$ was 0.55 W/mK and increased with the temperature above 450 K because of the bipolar electrical conduction which is consistent with the electrical transport measurements. After Cd doping, thermal conductivity (κ) of $AgSb_{1-x}Cd_xTe_2$ further decreased. The room temperature lattice thermal conductivity ($κ_{lat}$) of $AgSb_{0.94}Cd_{0.06}Te_2$ sample was 0.16 W/mK and 0.17 W/mK at 573 K. $κ_{lat}$ also decreased with increasing Cd concentration (FIG. 5b). Consequently, $AgSb_{0.94}Cd_{0.06}Te_2$ exhibited ultra-low $κ_{lat}$ of ~0.16 W/mK at room temperature. Such low thermal conductivity value is close to the lattice thermal conductivity of single crystalline SnSe and lower than other state-of-the-art chalcogenide-based materials.

Specific heat capacity (Cp) of $AgSb_{0.94}Cd_{0.06}Te_2$ sample was measured in the temperature range of 2-35 K (FIGS. 5c and 5d) to understand the origin of ultra-low $κ_{lat}$ in polycrystalline $AgSb_{1-x}Cd_xTe_2$ and the experimental data were fitted by using Debye-Einstein model. The solid line was calculated using the combined Debye-Einstein model. The individual contributions from electronic (γ), Debye (β) and the three Einstein terms (E1, E2, E3) were also plotted. It was observed that the temperature variation of Cp in the low temperature regime cannot be adequately described only with Debye modes of acoustic phonons and requires at least three Einstein modes whose typical temperatures are obtained from the fits are 27 K (θE1~18.8 cm$^{-1}$), 56 K (θE2~38.9 cm$^{-1}$) and 105 K (θE3~72.98 cm$^{-1}$) (refer Table 3). The presence of a broad Boson-like peak in $C_p/T^3$ vs T plot at low temperature (FIG. 5d) signifies the presence of excess phonon density of states and contribution to $C_p$ from low energy optical phonon modes.

TABLE 3

Derived parameters obtained by modeling low temperature Cp/T vs $T^2$ data of $AgSb_{0.94}Cd_{0.06}Te_2$ by using combined Debye-Einstein modes

| Parameters | Debye-Einstein Model |
|---|---|
| γ ($10^{-3}$ J mol$^{-1}$ K$^{-2}$) | 12.97 |
| β ($10^{-4}$ J mol$^{-1}$ K$^{-2}$) | 1.841 |
| $Θ_{E1}$ (K) | 27.76 |
| $Θ_{E2}$ (K) | 56.06 |
| $Θ_{E3}$ (K) | 105.71 |
| Debye temperature, $Θ_D$ (K) | 160 |
| R2 | 0.99998 |

These low-frequency Einstein modes arose because of the soft vibrations of Ag and/or Sb cations in $AgSb_{0.94}Cd_{0.06}Te_2$. These low-frequency optical phonons are expected to strongly couple with the heat carrying acoustic phonons and suppress the lattice thermal conductivity of $AgSb_{0.94}Cd_{0.06}Te_2$.

Figure 6:
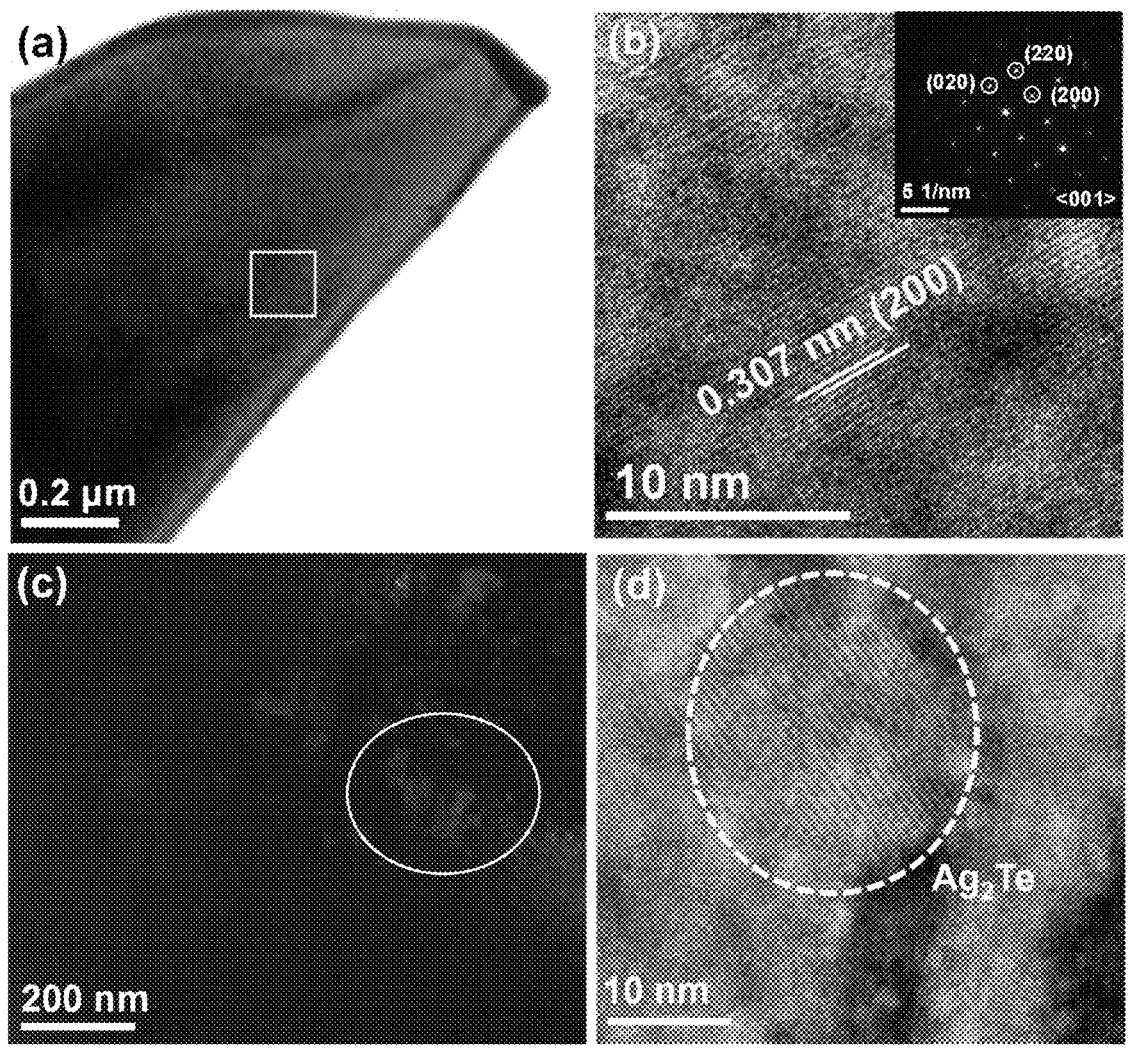
FIG. 6(a-d) illustrate the low magnification and high resolution transmission electron microscopy (HRTEM)

Transmission electron microscopy (TEM) investigations of $AgSbTe_2$ and $AgSb_{0.94}Cd_{0.06}Te_2$ samples were performed to further understand the microscopic origin and the role of Cd doping in lowering lattice thermal conductivity (FIGS. 6 and 7). FIG. 6a shows the low magnification TEM image of $AgSbTe_2$. HRTEM of the highlighted area of (a) is depicted in High resolution TEM (HRTEM) image showed the distance between two lattice fringes as 0.307 nm, corresponding to the (200) plane of cubic $AgSbTe_2$ (FIG. 6b). Selected area electron diffraction (SAED) pattern confirmed the single crystalline nature of the domains without the presence of any superstructure spots similar to the previous reports of polycrystalline $AgSbTe_2$ (inset of FIG. 6b). Dark-field TEM showed the presence of impurity phases in $AgSbTe_2$ matrix which was confirmed as α-Ag$_2$Te phase by HRTEM analysis (FIGS. 6c and 6d). The presence of nanoscale superstructures is confirmed by HRTEM image of AgSb$_{0.94}$Cd$_{0.06}$Te$_2$ (FIG. 7a) and corresponding fast Fourier transformation (FFT) image (inset of FIG. 7a). The size of these nanoscale ordered superstructure domains was calculated to be ~2-4 nm in AgSb$_{0.94}$Cd$_{0.06}$Te$_2$ by extensive HRTEM analysis. The presence of these nanoscale superstructures is formed by cation ordering by Cd doping, which provides significant phonon scattering and reduce the lattice thermal conductivity in Cd doped AgSbTe$_2$ compositions. Moreover, convincing superlattice spots (due to nanoscale superstructure) in SAED pattern are showed by small arrows (FIG. 7b). Different areas on the AgSb$_{0.94}$Cd$_{0.06}$Te$_2$ sample were analyzed by HRTEM (FIG. 7c) and similar superstructure features were observed in corresponding FFT image (inset FIG. 7c). Strain ripples in TEM image of AgSb$_{0.94}$Cd$_{0.06}$Te$_2$ were also observed (FIG. 7d). This strain ripples appeared because of the difference in lattices of multiple ordered configurations all of which can form because of very small energy difference between the ordered structure of Cd doped AgSbTe$_2$ In summary, Cd doped polycrystalline AgSbTe$_2$ samples demonstrate record high thermoelectric performance in the temperature range of 300-600 K. A significant increase in room temperature zT from 0.6 for pristine AgSbTe$_2$ to 1.5 at 300 K for AgSb$_{0.94}$Cd$_{0.06}$Te$_2$ and a maximum zT of 2.6 at 573 K in polycrystalline AgSb$_{0.94}$Cd$_{0.06}$Te$_2$ was observed. High zT over a wide temperature range also resulted in a high $ZT_{dev}$ of ~1.9 for the 300-600 K temperature regimes which is the highest value so far in thermoelectric materials. Cd doped AgSbTe$_2$ outperformed all other state-of-the-art p-type polycrystalline and single crystalline thermoelectric materials in the temperature range of 300-600 K. This high thermoelectric performance originated from the Cd doping as a result of increased electrical conductivity due to Cd$^{2+}$ acting as an acceptor dopant as well as delocalization of electronic states due to enhanced cation ordering in AgSbTe$_2$ and the suppression of n-type Ag$_2$Te phase, and decreased thermal conductivity due to the spontaneous formation of nanoscale superstructure with enhanced cationic ordering, which caused enhance phonon scattering.

Interestingly, p-type material of the present disclosure (Cd doped AgSbTe$_2$) samples covered the region of low and mid temperature and showed the possibility of relieving the necessity of different materials for different temperature regimes with a single material starting from room- to mid-temperature. Thus, identifying AgSb$_{1-x}$Cd$_x$Te$_2$ as a potential candidate for being a p-type Pb-free material for room temperature to mid-temperature thermoelectric applications.

Advantages of the Present Disclosure

The present disclosure reveals a p-type material of Formula I. The p-type material is a lead-free material which was found to be excellent for thermoelectric power generation. The p-type material of the present disclosure can be utilized in various sectors, such as automobile industry, heavy trucks and vehicles, coal based electrical power generation units, steel plants, cement plant, nuclear reactors, oil refineries and in space industries. The present disclosure also provides a convenient process for preparing the p-type material.

We claim:
1. A p-type material of Formula I:

$$AgSb_{1-x}Cd_xTe_2 \qquad \text{Formula I,}$$

wherein x is in a range of 0.01-0.07.

2. The p-type material as claimed in claim 1, wherein x is in a range 0.02-0.06.

3. The p-type material as claimed in claim 1, wherein the material has a lattice thermal conductivity ($\kappa_{lat}$) at 300 K in a range of 0.34-0.16 W/mK.

4. The p-type material as claimed in claim 1, wherein the material has an electrical conductivity (σ) at 300 K in a range of 156-222 S/cm.

5. The p-type material as claimed in claim 1, wherein the material has a thermoelectric figure of merit (zT) at 300 K in a range of 0.8-1.5.

6. The p-type material as claimed in claim 1, wherein the material has a thermoelectric figure of merit (zT) at 573 K in a range of 1.8-2.6.

7. The p-type material as claimed in claim 1, wherein the material is a lead-free material.

8. The p-type material as claimed in claim 1 for use as thermoelectric material.

9. A process for preparing the p-type material as claimed in claim 1, comprising:
  a) contacting a combination of precursors selected from silver, antimony, cadmium and tellurium to obtain a first mixture;
  b) heating the first mixture at a first temperature followed by heating at a second temperature to obtain a melt;
  c) processing the melt to obtain a second mixture; and
  d) cooling the second mixture to obtain the p-type material.

10. The process as claimed in claim 9, wherein heating the first mixture at a first temperature is carried out at a temperature of 650-750 K for a period in the range of 10-14 hours under a pressure in the range of $10^{-4}$-$10^{-6}$ torr.

11. The process as claimed in claim 9, wherein heating at a second temperature is carried out at a temperature in the range of 1100-1200 K for a period in the range of 2-5 hours under a pressure in the range of $10^{-4}$-$10^{-6}$ torr.

12. The process as claimed in claim 9, wherein processing the melt to obtain a second mixture is carried out by soaking the melt for a period in the range of 5-15 hours for temperature in the range of 1100-1200 K under a pressure in the range of $10^{-4}$-$10^{-6}$ torr.

13. The process as claimed in claim 9, wherein cooling the second mixture is carried out at a cooling rate in the range of 0.65-0.75 K/min to achieve temperature of in the range of 290-320 K.

* * * * *